United States Patent [19]

Baldwin et al.

[11] 4,401,003
[45] Aug. 30, 1983

[54] LEAD TRIMMER FOR PRINTED CIRCUIT BOARDS

[75] Inventors: Wilbur A. Baldwin, Centerport, N.Y.; Richard Silverman, Clark, N.J.; Leigh Jezorek, Hillsboro, N.J.; Irving Pitel, Edison, N.J.

[73] Assignee: Roto Form Sales Corp., Lake Grove, N.Y.

[21] Appl. No.: 299,056

[22] Filed: Sep. 3, 1981

[51] Int. Cl.³ .......................... B26D 1/16; B26D 7/01
[52] U.S. Cl. ........................................ 83/483; 83/490; 83/454; 83/925 R
[58] Field of Search ................. 83/483, 490, 648, 454, 83/409, 925 R, 471, 471.2, 477.1

[56] References Cited

U.S. PATENT DOCUMENTS

| | | | |
|---|---|---|---|
| 3,307,442 | 3/1967 | Imhoff | 83/925 R X |
| 3,453,918 | 7/1969 | Sharp | 83/925 R X |
| 3,935,773 | 3/1976 | Daebler | 83/925 R X |
| 4,072,077 | 2/1978 | Morgan | 83/925 R X |
| 4,170,156 | 10/1979 | Kondo | 83/404 X |
| 4,187,751 | 2/1980 | Barnacle | 83/925 R X |
| 4,200,018 | 4/1980 | Sekiwa | 83/925 R X |

Primary Examiner—Donald R. Schran
Attorney, Agent, or Firm—Lawrence S. Lawrence

[57] ABSTRACT

An apparatus for trimming the wire leads of electronic components mounted on printed circuit boards is provided, which comprises a base plate, an adjustable holding fixture for a printed circuit board fixedly disposed on the base plate, a pivotable cantilevered bracket assembly mounted on the base plate adjacent the holding fixture, a motor-driven rotary cutting blade disposed on the end of the cantilevered pivotally movable bracket assembly for movement along the surface of a printed circuit board disposed within the holding fixture, and an anti-warp device including one or more pivotable lever arms disposed above and below the printed circuit board, and an adjustable pin mounted on each of the upper lever arm to engage the top surface of said printed circuit board and urge the same into a flattened position and an adjustable pin disposed in each of the lower lever arms to engage the bottom surface of said printed circuit board to urge the same in a flattened position.

5 Claims, 3 Drawing Figures

LEAD TRIMMER FOR PRINTED CIRCUIT BOARDS

BACKGROUND OF THE INVENTION

In the manufacture of electronic devices it is common practice to insert electronic parts and components, such as resistors, capacitors and transistors into preformed holes in a printed circuit board, and to solder such components in place. After soldering, it is usually necessary to trim the wire leads of the various components which extend through the printed circuit board to prevent short circuiting. To accomplish this, cutting and trimming devices of various designs and configurations have been provided, which generally comprise means for holding a circuit board, and a motor driven rotatable cutting blade, which is movable relative to the surface of a printed circuit board disposed in the holding means. Examples of wire lead trimming devices of this type are disclosed in U.S. Pat. Nos. 3,307,442 to Imhoff, 3,453,918 to Sharp and 4,132,137 to Albert.

It has been found that printed circuit boards are susceptible to warpage during and after the soldering operation. Accordingly, while the wire lead trimmers disclosed in the aforesaid patents perform satisfactorily under most conditions, in the case of a warped board, they tend to trim the wire leads unevenly and in some cases actually contact the surface of the board, causing damage thereto. This problem has been recognized in the prior art and attempts have been made to provide means for straightening warped circuit boards. In U.S. Pat. No. 3,972,262 to Albert, rotating brushes having stiff bristles are disposed beneath the path of a printed circuit board as it fed along a machine adapted to trim the wire leads after flow soldering. If the board is downwardly bowed, the brushes contract the center section thereof to lift the same into a relatively flat position so that each of the wires will be trimmed to approximately the same length. However, Albert makes no provision for straightening a warped board which is upwardly bowed. Similarly, U.S. Pat. No. 4,072,077 to Morgan and U.S. Pat. No. 4,170,156 to Condo also provide means for straightening a printed circuit board which is bowed downwardly, and suggest no means for flattening a board bowed in the upward direction. In the Morgan patent a series of wheels press against the under surface of a downwardly bowed board in the same manner as the bristles of Albert's brushes. Similarly, Condo uses a series of rotating pins, which are very similar to the Albert brushes, to accomplish the same function.

Unfortunately, since printed circuit boards can be warped in either the upward or downward direction, the attempts to cure the problem of uneven lead trimming in the patents mentioned herein have proved to be inadequate.

SUMMARY OF THE INVENTION

In accordance with the present invention, a lead trimmer for printed circuit boards is provided which overcomes the deficiencies found in the prior art in that it includes an anti-warp device, which is adapted to straighten a board that is warped or deformed in either the upward or downward direction, so as to insure substantially uniform trimming of the leads of the electronic components installed thereon. This is accomplished by means of manually adjustable pins mounted on pivotable lever arms disposed above and below the printed circuit board. The pins are adapted to engage the top and bottom surfaces of a warped board to urge the same into a flattened position.

In general, the lead trimmer of the invention comprises a base plate, an adjustable holding fixture for printed circuit boards mounted on the base plate, a cantilevered bracket assembly pivotally mounted on the base plate, a motor driven rotary cutting blade disposed on the end of the cantilevered bracket assembly for movement in a plane parallel to and adjacent the surface of a printed circuit board disposed in the holding fixture to trim the wire leads thereon without damaging the board, and an anti-warp device for straightening a printed circuit board disposed in the holding fixture, including at least one pair of pivotable lever arms disposed above and below the holding fixture, and an adjustable pin mounted on each pivotable lever arm to contact the top and bottom surfaces, respectively, of the printed circuit board to urge the same into a straightened position.

The holding fixture preferably comprises a pair of parallel spaced apart elongated brackets each having a dovetail groove extending along an upper edge thereof to receive the opposite edges of a printed circuit board. One of said brackets is mounted upon the base plate for sliding adjustable movement to accommodate various size printed circuit boards. The other bracket is fixed to the base plate in a permanent location. However, to facilitate the installation of a printed circuit board in the holding fixture and its removal therefrom, a slight degree of movability is provided by means of a spring loaded locking lever which is connected to such bracket. Moreover, both brackets can be adjustably mounted for upward or downward vertical movement in order to locate a printed circuit board in a cutting position relative to the blade.

The cantilevered bracket assembly comprises a vertically disposed shaft fixedly mounted on the base plate, a first arm pivotally mounted on said shaft for movement in a horizontal plane, and a second arm pivotally connected to the free end of the first arm for movement in the same horizontal plane. An electric motor, preferably of the variable speed type, is fixedly connected to the end of the second arm. The motor includes a drive shaft to which the rotary cutting blade is attached. The vertical position of the blade relative to a circuit board in the holding fixture is adjustable by moving the first arm upwardly or downwardly on the shaft. To secure the arm in the appropriate position the shaft can be threaded and adjustment nuts can be threadably disposed thereon above and below the arm.

To facilitate movement of the cutting blade along the surface of a circuit board during the trimming operation, the drive shaft extends through a hollow handle to be grasped by an operator. As a safety feature, the handle can be provided with a switch for activating the motor, and thereby prevent the operation of the cutter, unless such handle is being held. A second switch located at the front of the base plate requiring activation by the operator's second hand is wired in series with the handle switch. In this manner, each hand must be in contact with a separate switch before the blade will rotate.

The anti-warp device comprises a first lever arm pivotally connected to one bracket of the holding fixture for movement in a horizontal plane above and parallel to the plane of a printed circuit board disposed in the holding fixture. The arm includes a plurality of threaded openings extending therethrough perpendicularly to the plane of pivotal movement to receive one or more threaded pins. Such pins extend through the threaded openings to engage the surface of a printed circuit board. The number of adjustable pins utilized, their position on the lever arm, as well as the position of the lever arm itself relative to the printed circuit board depends on the location of and the degree of warpage or upward deformation experienced by a particular printed circuit board. To correct the condition, the threaded pins are rotated while in contact with the warped surface of a printed circuit board to force the same into a straightened position. It should be noted that one or more additional lever arms, each containing an adjustable pin, can also be pivotally connected to the holding fixture bracket to supplement the first lever arm. Such additional arms are particularly useful for straightening large or extremely warped printed circuit boards.

One or more second lever arms are pivotally and slidable mounted on the base plate between the two brackets of the holding fixture. Each lever includes an upstanding vertically disposed pin adjustably connected to the end thereof to engage the under surface of a printed circuit board in the holding fixture. The pin is threadably connected to the lever arm so that the vertical position of its top can be adjusted to correspond to the correct flattened horizontal position of a printed circuit board. In this manner, a downwardly bowed circuit board is forced upwardly upon its contact with the pin as it is installed in the holding fixture, and an upwardly bowed or warped printed circuit board is forced downwardly into contact with the lower pin by the adjustable pin disposed on the upper pivotable lever arm. Both the upper and lower lever arms are movable so that they may be located in an area of warpage or deformation.

The lead trimmer of the invention is further described in the drawings.

DETAILED DESCRIPTION OF PREFERRED EMBODIMENT

Figure 1:
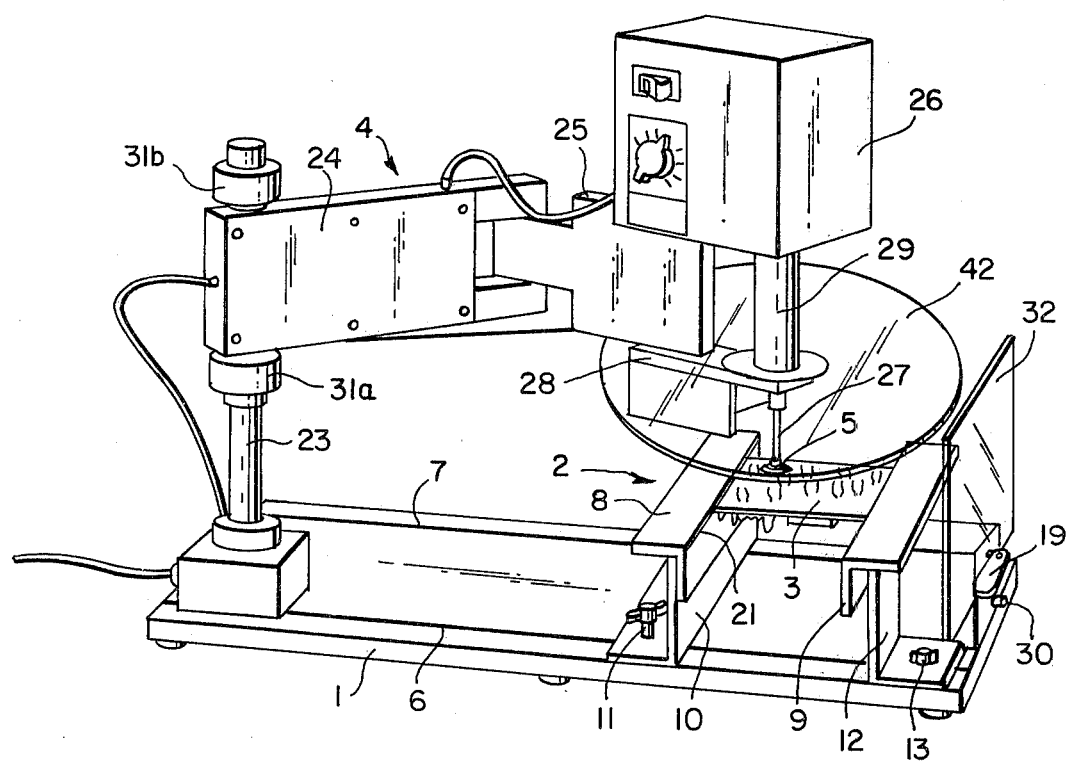
FIG. 1 is a side perspective view of the lead trimmer of the invention.

Referring to FIG. 1, it can be seen that the lead trimmer of the invention comprises a base plate 1, an adjustable holding fixture 2 for receiving a printed circuit board 3 upon which have been soldered various electronic components having wire leads, a pivotable cantilevered bracket assembly 4 mounted on base plate 1, and a motor driven rotary cutting blade 5 disposed on the end of the cantilevered bracket assembly adjacent the holding fixture 2.

Holding fixture 2 comprises a pair of spaced apart angle brackets 8 and 9, each of which includes a dovetail groove 21 and 22, respectively, which extends along the entire inner edge thereof. Printed circuit board 3 is adapted to fit within grooves 21 and 22 to be secured in place during the wire trimming operation. Bracket 8 is connected to a mounting bracket 10 which is adapted to ride within a pair of slots 6 and 7 formed in base plate 1. A corresponding pair of manually adjustable set screws 11 (only one shown) extend through slots 6 and 7 to guide bracket 8 therealong to accommodate varying sized printed circuit boards and to secure the same in the desired position. Similarly, bracket 8 is mounted for slight vertical movement on mounting bracket 10 to adjust the position of dovetail groove 21 relative to cutting blade 5, by means of set screws which extend through slotted openings (not shown). Bracket 9 is adjustably mounted for limited horizontal movement upon another L-shaped bracket 12, which in turn is fixedly mounted to base plate 1 by means of screws 13. The horizontal adjustability of bracket 9 is accomplished by means of a spring loaded locking mechanism 14 best seen in FIGS. 2 and 3. The locking mechanism comprises a shaft 15 threadably connected to one side of bracket 9, and a spring 16 disposed around shaft 15 and extending between bracket 12 and bracket 9 to bias the latter toward bracket 8 to thereby secure a printed circuit board placed in the holding fixture. Shaft 15 extends outwardly through a sleeve 17 and a mounting plate 18. A lever arm handle 19 has a cammed front end 20, which is pivotally connected in an off-center manner to the end of shaft 15. In this manner, pivotal movement of the lever 19 either tightens or loosens the holding fixture to secure or release a printed circuit board. Bracket 9 is also mounted for vertical adjustability in the same manner as bracket 8.

Referring once again to FIG. 1, the cantilevered bracket assembly 4 comprises a threaded shaft 23 fixedly mounted on base plate 1 and extending upwardly therefrom, a first arm 24 pivotally mounted on shaft 23 for swinging movement in a plane parallel to base plate 1, and a second arm 25 pivotally connected to the free end of arm 24 to form an articulated assembly. A variable speed electric motor 26 is fixedly disposed on the end of arm 25 for movement therewith. A drive shaft 27 extends downwardly from motor 26 and carries cutting blade 5 at the end thereof. A plate 28 is fixedly mounted on the lower surface of arm 25 and has an opening therein through which shaft 27 passes. A hollow handle 29 is disposed about shaft 27, and extends between plate 28 and motor 26. When grasped by an operator the handle permits movement of the cantilevered bracket assembly to properly locate cutting blade 5 along the surface of a printed circuit board 3 held in the holding fixture to trim the wire leads thereon.

As a safety feature, handle 29 includes a switch for motor 26, which is operable by sliding the handle downwardly toward plate 28. To insure that both hands of an operator cannot contact the blade during the cutting operation, a second switch 30 disposed at the front of base plate 1 and wired in series with the handle switch is provided. Switch 30 is operable by pressing the same with one hand while the handle switch is operable by the other hand. Both switches must be activated simultaneously in order for motor 26 to receive power.

The height of cutting blade 5 in respect to the surface of printed circuit board 3 is adjustable by moving arm 24 either upwardly or downwardly along shaft 23. Such adjustments can be accomplished by means of knurled nuts 31a and 31b disposed on shaft 23 above and below arm 24.

As an additional safety feature, a first transparent acrylic shield 32 is mounted adjacent handle 19 at the front of holding fixture 2, and a second transparent acrylic shield 42 is mounted on plate 28, both of said shields being intended to prevent wire cuttings from being projected on to an operator.

Figure 2:
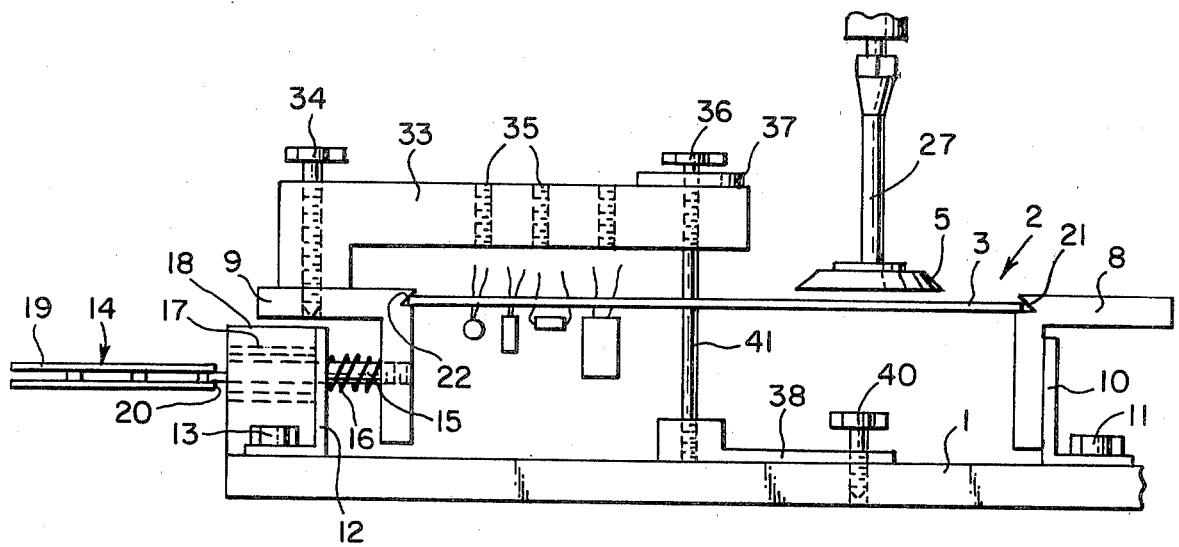
FIG. 2 is a side view of the printed circuit board holding fixture illustrating the anti-warp device.
Figure 3:
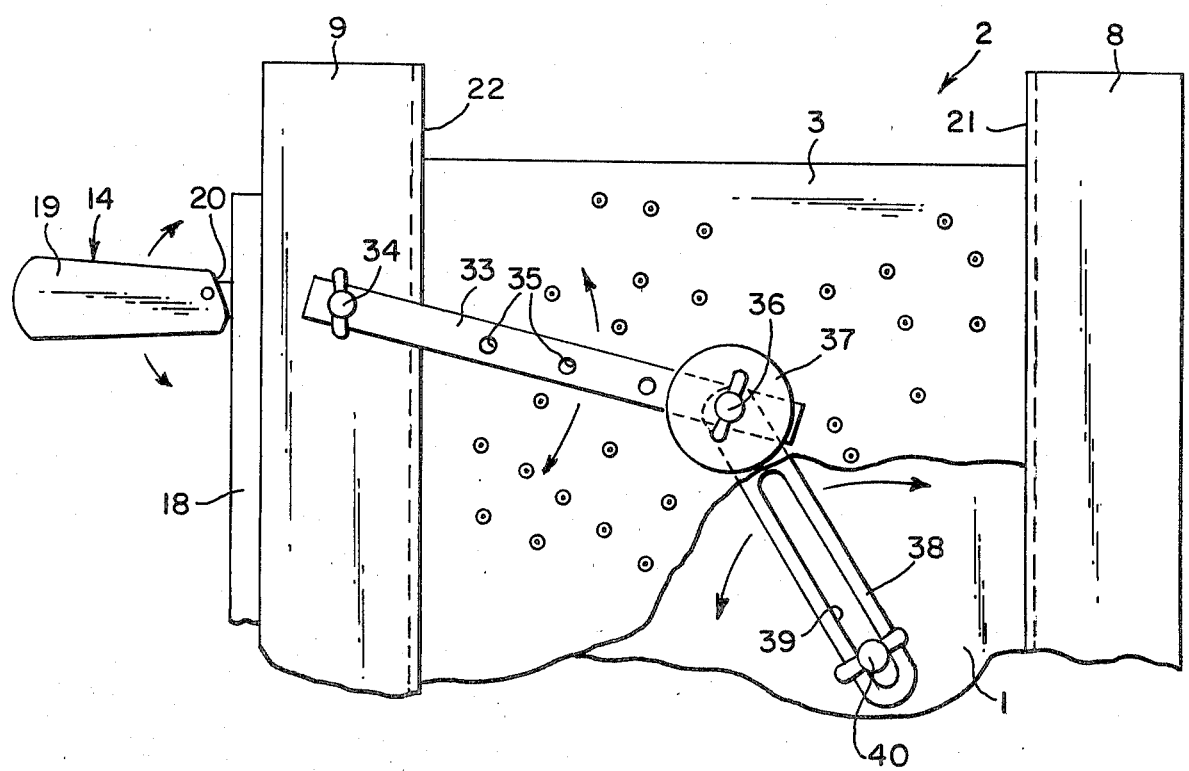
FIG. 3 is a top view of the anti-warp device.

The anti-warp device of the invention is best seen in FIGS. 2 and 3. Such device comprises a first lever arm 33 connected to holding fixture bracket 9 by means of thumb screw 34 for pivotal movement in a horizontal plane above and parallel to the plane of a printed circuit board 3 disposed in holding fixture 2. Arm 33 includes a plurality of threaded openings 35 extending therethrough perpendicularly to the plane of pivotal movement. The openings are adapted to receive one or more thumb screws. A single thumb screw 36 is shown in FIG. 2 disposed in the outermost opening. The thumb screws, which have been referred to herein as adjustment pins, extend through the threaded openings to engage the surface of a printed circuit board 3. The number of pins 36 utilized and their position on lever arm 33 depends on the location and the degree of warpage of a particular printed circuit board. It can be seen that rotation of the thumb screw moves the end thereof into contact with the top surface of the printed circuit board and that continued rotation forces the same into a straightened position. A transparent plastic disc 37 is formed of Lexan or the like is held in place on top of lever 33 by means of the thumb screw 36. The diameter of the disc is greater than the diameter of cutting blade 5, so that drive shaft 27 during movement along the surface of a printed circuit board will engage the outer periphery thereof to thereby prevent the cutting blade from contacting and damaging the adjustment pin. It will be apparent to those skilled in the art that one or more additional lever arms having adjustable pins can be disposed on bracket 8 or bracket 9 in the same manner as lever 33.

A second lever arm 38 is pivotally and slidably mounted on base plate 1 between brackets 8 and 9 of the holding fixture. Lever 38 includes a slotted opening 39 through which a thumb screw 40 is disposed to connect the same to the base plate. An upstanding vertically disposed pin 41 is threadably connected to the end of lever 38, and is adapted to adjustably engage the under surface of printed circuit board 3. The top of pin 41 can be placed in a vertical position in line with the horizontal plane of the bottom of a flattened printed circuit board held in the holding fixture. In this manner a downwardly bowed circuit board is forced upwardly upon its contact with the pin 41 as it is installed in the holding fixture, and an upwardly bowed or warped printed circuit board is forced downwardly into contact with the pin 41 by pin 36 disposed above the circuit board.

In operation, the position of bracket 8 of holding fixture 2 is adjusted to accommodate the size of a printed circuit board 3 to be trimmed. Having made such adjustment set screws 11 are tightened to secure the bracket in the proper location. Next, handle 19 of locking device 14 is pivotally moved to overcome the force of spring 16 and to retract bracket 9 from its at rest position. The printed circuit board is then inserted into the holding fixture and the handle 19 rotatably moved into its locked position, so that spring 16 biases bracket 9 against the printed circuit board to hold the same in place. Upon the insertion of the printed circuit board into the holding board into the holding fixture, the same comes in contact with pin 41 of the anti-warp device, which is adjustable by tightening or loosening thumb screw 40 to locate the same beneath the appropriate portion of the printed circuit board. In this manner, any portion of the printed circuit board which is downwardly bowed or warped in a downward direction will be urged upwardly by pin 41. Similarly, a printed circuit board which is upwardly bowed or warped in a upward direction can be contacted by pin 36 disposed on the anti-warp device above printed circuit board 3 to force the printed circuit board downwardly into contact with pin 41 in order to maintain the same in a straightened position during the cutting operation.

The operator next grasps handle 29 to move cutting blade 5 to the appropriate location above the printed circuit board held in the holding fixture. The vertical height of the cutting blade 5 is adjusted by moving the cantilevered bracket assembly upwardly or downwardly upon shaft 27, so that cutting blade 5 engages the wire leads of the electronic components soldered to the printed circuit board adjacent to surface thereof, without contacting the surface of the board. The operator next presses switch 30 while simultaneously activating the switch in handle 29 to energize motor 26, and thus drive cutting blade 5. The operator then moves the cutting blade along the surface of the printed circuit board to trim each of the wire leads.

Although the invention has been described in reference to a single embodiment, additional modifications and variations thereof, as well as additional embodiments falling within the scope of the invention, will be apparent to those skilled in the art.

What is claimed is:

1. An apparatus for trimming the wire leads of electronic components soldered on printed circuit boards, comprising a base plate; an adjustable holding fixture for receiving a printed circuit board mounted on the base plate; a cantilevered bracket assembly pivotally mounted on the base plate; a motor driven rotary cutting blade disposed on the end of the cantilevered bracket assembly for movement in a plane parallel to and adjacent to the surface of a printed circuit board disposed in the holding fixture to trim the wire leads thereon without damaging the board, and an anti-warp device for straightening a printed circuit board disposed in the holding fixture, including a pair of pivotable lever arms disposed above and below the holding fixture and a pin mounted on each pivotable lever arm to contact the top and bottom surfaces, respectively, of the printed circuit board to urge the same into a straightened position.

2. A lead trimming apparatus in accordance with claim 1, in which the holding fixture comprises a pair of parallel spaced apart elongated brackets, each having a dovetail groove extending along an upper edge thereof to receive opposite edges of a printed circuit board.

3. A lead trimming apparatus in accordance with claim 2, in which one of said brackets of the holding fixture is adjustably movable along the base plate to accommodate printed circuit boards of varying size; and the other of said brackets includes means for locking the same in engagement with a printed circuit board.

4. A lead trimming apparatus in accordance with claim 1, in which the cantilevered bracket assembly comprises a vertically disposed shaft fixedly mounted on the base plate; a first arm pivotally mounted on said shaft for movement in the same horizontal plane; a second arm pivotally connected to the free end of said first arm for movement in the same horizontal plane; a drive motor fixedly mounted to the free end of the second arm; and a drive shaft connecting the motor and the rotary cutting blade.

5. A lead trimming apparatus in accordance with claim 1, in which the anti-warp device comprises a first lever arm pivotally connected to the holding fixture for movement in a horizontal plane above and parallel to the plane of a printed circuit board disposed in the holding fixture, an adjustable pin extending through said first lever arm to engage the surface of a printed circuit board, a second lever arm pivotally and slidably mounted on the base plate beneath the plane of a printed circuit board; held in the holding fixture; and an upstanding vertically disposed pin adjustably connected to the end of said second lever arm to engage the under surface of a printed circuit board and urge the same upwardly to correct a downwardly bowed condition.

* * * * *